United States Patent [19]

Kulesza et al.

[11] Patent Number: 5,196,371
[45] Date of Patent: Mar. 23, 1993

[54] FLIP CHIP BONDING METHOD USING ELECTRICALLY CONDUCTIVE POLYMER BUMPS

[75] Inventors: Frank W. Kulesza, Winchester, Mass.; Richard H. Estes, Pelham, N.H.

[73] Assignee: Epoxy Technology, Inc., Billerica, Mass.

[21] Appl. No.: 746,333

[22] Filed: Aug. 16, 1991

Related U.S. Application Data

[63] Continuation-in-part of Ser. No. 452,191, Dec. 18, 1989, Pat. No. 5,074,947.

[51] Int. Cl.⁵ .................. H01L 21/56; H01L 21/58; H01L 21/60

[52] U.S. Cl. .................. 437/183; 437/209; 437/211; 29/831; 29/842

[58] Field of Search ............. 437/183, 205, 203, 208, 437/209, 211, 915; 29/831, 842; 361/403, 409, 418

[56] References Cited

U.S. PATENT DOCUMENTS

| | | | |
|---|---|---|---|
| 4,442,966 | 4/1984 | Jourdain et al. | 228/123 |
| 4,612,083 | 9/1986 | Yasumoto et al. | 437/208 |
| 4,914,057 | 4/1990 | Gloton | 437/183 |
| 4,922,321 | 5/1990 | Arai et al. | 357/68 |
| 4,967,314 | 10/1990 | Higgins, III | 361/410 |
| 4,991,000 | 2/1991 | Bone et al. | 357/68 |
| 5,090,119 | 2/1992 | Tsuda et al. | 29/843 |

FOREIGN PATENT DOCUMENTS

| | | |
|---|---|---|
| 0303256 | 8/1989 | European Pat. Off. |
| 57-176738 | 9/1982 | Japan |
| 62-283644 | 12/1987 | Japan |
| 63-220533 | 9/1988 | Japan |
| 63-283144 | 11/1988 | Japan |
| 018647 | 1/1989 | Japan |
| 0176608 | 3/1989 | Japan |
| 0181181 | 3/1989 | Japan |
| 0189526 | 4/1989 | Japan |
| 01120039 | 5/1989 | Japan |
| 01251643 | 8/1989 | Japan |
| 01305541 | 12/1989 | Japan |
| WO91/14014 | 10/1991 | PCT Int'l Appl. |

OTHER PUBLICATIONS

Mandal, "Evaluation of Advanced Microelectronic Fluxless Solder-Bump Contacts for Hybrid Microcircuits," NASA Contractor Report NAS 8-31496 (1976).

Shumay, *Advanced Materials and Processes*, 130(5): 38 (1986).

Ginsberg, *Electronic Packaging and Production*, 25(9):140 (1985).

Patent Abstracts of Japan, vol. 9, No. 110 (E-314) (1833) (1985).

Delfs, In: Moderne Aufbau—Und Verbindungstechniken in der Mikioelektronik Proceedings Seminar, Berlin (1982).

Kawanobe, et al., In: Proceedings: 31st IEEE Electronic Components Conference, Atlanta (1981).

Szczepanski, "Promising Techniques in On-Chip Assembly of Semiconducting Components and Monolithic Integrated Circuits", NAS 13-33 77A31551, *Elektronika*, 17(2):57-61 (1977).

Doo, et al., IBM Technical Disclosure Bulletin (USA), 20(4):1440 (1977).

Markstein, *Electronic Packaging and Production*, 27(10):46 (1987).

*Primary Examiner*—Olik Chaudhuri
*Assistant Examiner*—David E. Graybill
*Attorney, Agent, or Firm*—Hamilton, Brook, Smith & Reynolds

[57] ABSTRACT

A method is presented for interconnecting bond pads of a flip chip with bond pads of a substrate by an electrically conductive polymer. A first organic protective layer is selectively formed over a surface of a flip chip to thereby leave exposed bond pads on the flip chip. An electrically conductive polymerizable precursor is disposed on the bond pads extending to a level beyond the organic protective layer. The first and second layers are polymerized to form electrically conductive bumps. A second organic protective layer is then formed on the surface of the substrate around the substrate bond pads, leaving the substrate bond pads exposed. An electrically conductive adhesive is then disposed on the substrate bond pads. The bumps are aligned with bond pads of a substrate and then contacted to those bond pads. The adhesive is polymerized to form electrical interconnections between the flip chip bond pads and the substrate bond pads.

19 Claims, 2 Drawing Sheets

FLIP CHIP BONDING METHOD USING ELECTRICALLY CONDUCTIVE POLYMER BUMPS

RELATED APPLICATIONS

This is a continuation-in-part of U.S. patent application Ser. No. 07/452,191, now U.S. Pat. No. 5,074,947, and filed Dec. 18, 1989.

BACKGROUND OF THE INVENTION

Integrated circuits have had almost universal application to communication and military technologies for several years. Of increasing importance has been development of microcircuit wafers and methods for interconnection of the circuits by automated equipment. A primary limitation to application of microcircuit technology has been cost efficiency and reliability of interconnection of integrated circuits on chips because of the small size of the chips, which often require hundreds of connections to be made within each circuit.

One method of circuit interconnection is called flip chip bonding. Flip chip bonding can offer a shorter signal path and, therefore, more rapid communication between circuits than can other methods, such as tape automated bonding (TAB) or conventional wire bonding, because bond pads on flip chips are not restricted to the periphery of the chip, but rather are usually located at one face of the chip opposite a substrate. In one method of flip chip bonding, a chip or die is formed with the requisite integrated circuit and interconnect wiring required for interconnecting the circuit with other chip circuits on a circuit board, such as a separate printed circuit board or substrate. Bond pads are located at points of interconnection. Bumps are formed by plating of several layers of metals on the bond pads of the flip chip. Following deposition, the chip is heated to reflow the metals, thus causing surface tension of the deposit to form hemispherical solder "bumps." The flip chip is subsequently severed from the wafer of which it was a part and "flipped" for alignment with the bond pads of a substrate. These bumps are then contacted with the bond pads of the substrate and uniformly heated to simultaneously form interconnects between aligned bond pads of the flip chip and the substrate.

Use of metals to interconnect bond pads of flip chips and substrates has required, however, that passivation of the flip chip be accomplished by use of a metal barrier such as titanium (Ti), tungsten (W) or silicon nitride ($Si_3N_4$). Both the metal, as a passivation (or barrier) material, and ceramic, as a substrate material, are generally necessitated to allow sufficient heating to enable reflow of the solder bumps for interconnection between the flip chip and the substrate without consequential damage to either.

Fabrication of circuits using bumped flip chips have also been limited by the inability to visually inspect interconnections between the flip chip and the substrate. Further, the yield of finished mounted circuits can be detrimentally affected by failure of interconnects caused by the difference between the coefficients of thermal expansion of the various materials comprising the flip chip, the passivation layer, the solder bumps and the substrate. Also, melting of the solder bumps creates an electrically conductive flux as an undesirable by-product which generally must be removed from between the substrate and the flip chip to allow proper operation of the finished circuit.

Problems of heat stress during fabrication have been addressed by various methods, such as by rapid application of heat to a bumped flip chip and rapid conduction of heat from the solder interconnects in order to minimize damage to flip chips, substrates and interconnections due to internal stresses caused by thermal expansion and contraction. However, this method is very expensive.

Therefore, a need exists for a method of interconnecting flip chips to substrates which is fast, cost-effective and reliable, so that the advantages of flip chips over other types of microcircuit wafers can be exploited more fully. Also, there is a demand for a simplified method of connecting flip chips to substrates which eliminates the need for elaborate plating procedures. Further, a method which enables greater flexibility of passivation and choice of substrate is also desirable. These improvements could promote cost efficiency and broaden the applications for which microcircuits are suitable.

SUMMARY OF THE INVENTION

The present invention relates to a bumped flip chip technology and a method for interconnecting the bond pads of a bumped flip chip to the bond pads of a substrate. In accordance with the present invention, a first organic protective layer is selectively formed over the surface of a flip chip, leaving the flip chip bond pads exposed. An electrically conductive polymerizable precursor is disposed at the bond pads of the flip chips to form "bumps" which extend beyond the organic protective layer. Alternatively, the electrically conductive polymerizable precursor can be formed in two layers at each bond pad, the two layers together forming the bumps. The two layers can be polymerized to form an electrically conductive bump before connecting the bump with bond pads of the substrate.

A second organic protective layer is selectively formed over a substrate around bond pads of the substrate, leaving the substrate bond pads exposed. An adhesive is then applied to the substrate bond pads to provide "wet," or electrically conductive, connections between the bumps and substrate which are subsequently polymerized. An electrically conductive polymer is thereby selectively formed between the bond pads of the flip chip and the bond pads of the substrate. Alternatively, the bumps can be polymerized after connecting the bumps of the flip chip to the bond pads of the substrate.

The second organic protective layer extends beyond the level of the substrate bond pads and facilitates positioning between the bumps at the flip chip bond pad and the substrate bond pads by forming recessed portions of the substrate at the substrate bond pads. Electrical interconnections between bond pads of flip chips and bond pads of substrates are obtained by formation of a electrically conductive polymerizable precursor at the bond pads of a flip chip. Polymerization of the bumps can be achieved under milder thermal conditions than are required to reflow solder. Thus, reliability problems, caused by rapid heating and by large discrepancies of coefficients of thermal expansion of component materials in the flip chip, passivation layer, bumps and substrates, can be substantially reduced. Further, because the polymerization conditions are less harsh than required for reflow of solder bumps, the need for metal passivation of the flip chip is eliminated and a wider variety of substrate types is enabled. Also, complicated and time-consuming vapor deposition and electroplating techniques for depositing solder bumps are eliminated. In addition, polymer interconnects are fluxless, thus eliminating difficult problems with removal of electrically conductive flux between flip chips and substrates. The organic protective layers can also have a low dielectric constant, thereby acting as a passivation layer and enabling close proximity of the flip chip to the substrate and consequent shortened circuit paths in the finished circuit.

The above features and other details of the invention, either as steps of the invention or as combinations of parts of the invention, will now be more particularly described with reference to the accompanying drawings and pointed out in the claims. It will be understood that the particular embodiments of the invention are shown by way of illustration and not as a limitation of the invention. The principle features of the invention may be employed in various embodiments without departing from the scope of the invention.

DETAILED DESCRIPTION OF THE INVENTION

Figure 1:
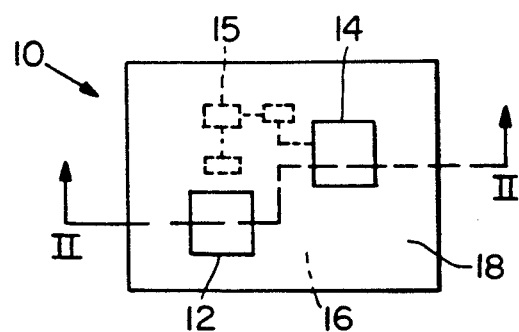
FIG. 1 is a plan view of one embodiment of the present invention after selective formation of a first organic protective layer over the surface of a flip chip.
Figure 2:
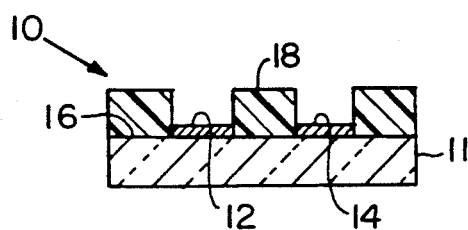
FIG. 2 is a section view of the embodiment of FIG. 1 taken along lines II—II.
Figure 3:
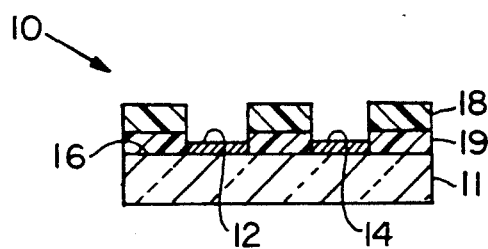
FIG. 3 is a section view of a flip chip which has been passivated with a silicon nitride or oxide layer, over which layer a first organic protective layer has been formed.

In one embodiment of the present invention, shown in FIG. 1, a simplified illustrative version of a flip chip 10 is shown. It consists of bond pads 12,14 on upper planar surface 16 of flip chip die 11. Die 11 is formed of silicon, gallium arsenide, germanium or some other conventional semiconductor material. As can be seen in FIG. 2, a first organic protective layer 18 is formed over circuits 15 (connected to the bond pads) and surface 16 of flip chip 10 by screen printing, stenciling, spin-etching or by other methods of monomer or polymer deposition. Alternatively, flip chip 10 also can be passivated with silicon nitride or an oxide layer 19 before formation of first organic protective layer 18, as is shown in FIG. 3. The organic protective layer is preferably a dielectric polymer. An example of an organic material suitable for application in the present invention is "Epo-Tek 600 ®" polyimide, manufactured by Epoxy Technology, Inc. Bond pads 12,14 are covered during deposition of first organic protective layer 18 and are then left exposed following deposition, as shown in FIG. 2. First organic protective layer 18 is preferably polymerized by application of heat or other conventional means prior to formation of layers 20,22 on bond pads 12,14, shown in FIG. 4. First organic protective layer 18 passivates and thereby insulates and protects the underlying surface 16 of flip chip 10.

Figure 4:
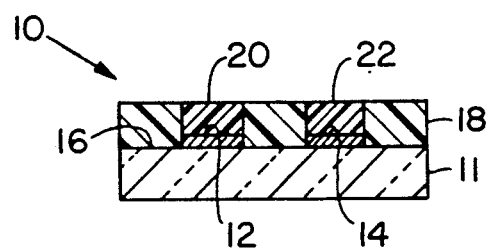
FIG. 4 is a section view of the embodiment of FIG. 1 after formation of the first electrically conductive polymerizable precursor layer on the flip chip bond pads.
Figure 5:
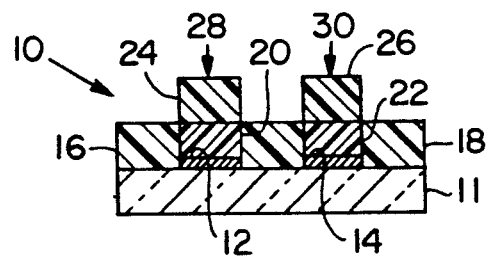
FIG. 5 is a section view of the embodiment of FIG. 1 after formation of a second electrically conductive polymerizable precursor layer on the first layer to thereby form bumps.

As shown in FIG. 4, first layers 20,22 of an electrically conductive polymerizable precursor are selectively formed on bond pads 12,14. Electrically conductive polymerizable precursor, as that term is used herein, can include a thermoset polymer, a B-stage polymer, a thermoplastic polymer, or any monomer or polymer which, upon polymerization or upon further polymerization, is electrically conductive or which can support an electrically conductive material. The electrically conductive polymerizable precursor can be gold-filled, silver-filled, or filled with some other electrically conductive material. The first organic protective layer 18 acts as a template defining areas for deposition of first layers 20,22 of monomer on flip chip 10. In a preferred embodiment of the present invention, the unpolymerized organic protective layer has a high thixotropy for retaining a pattern on surface 16. The flip chip 10 can thus be manipulated more conveniently during subsequent deposition of electrically conductive polymerizable precursor onto bond pads 12,14. First layers 20,22 are substantially flush with polyimide layer 18. Second layers 24,26 of electrically conductive polymerizable precursor, such as are used to form first layers 20,22, are formed on first layers 20,22, as shown in FIG. 5. First layers 20,22 and second layers 24,26 are then polymerized by a suitable method, such as is known in the art, to form electrically conductive bumps 28,30 on flip chip 10. Alternatively, if the electrically conductive polymerizable precursor is a thermoset, the first layers 20,22 can be polymerized before formation of the second layers 24,26.

Figure 6:
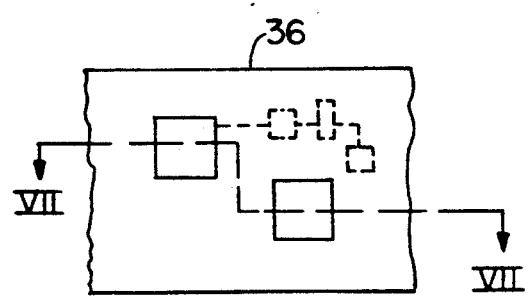
FIG. 6 is a plan view of a substrate suitable for use with the present invention.
Figure 7:
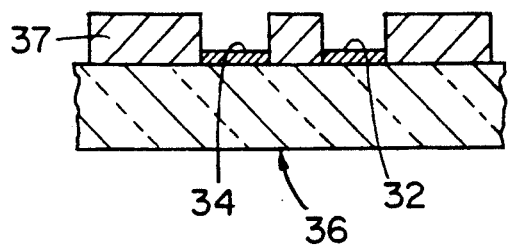
FIG. 7 is a section view of the embodiment of FIG. 6 taken along line VII—VII after a second organic protective layer has been selectively formed on the substrate.

As shown in FIG. 6, circuit 33 on substrate 36 is connected with bond pads 32,34. Substrates which are suitable for use with the present invention include materials such as ceramic, silicon, porcelain, conventional printed circuit board materials, or other conventional substrates suitable for forming electrical circuits. A second organic protective layer 37 is selectively formed on substrate 36 around bond pads 32,34 to a level extending beyond the level of substrate bond pads 32,34, as illustrated in FIG. 7. Suitable materials for forming second organic protective layer 37 and suitable methods of selectively forming second organic protective layer 37 are the same as for first organic protective layer 18.

Figure 8:
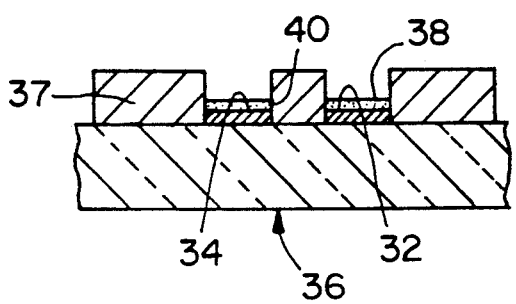
FIG. 8 is a section view of the embodiment shown in FIG. 7 after an adhesive layer has been disposed on the substrate bond pads.

As seen in FIG. 8, adhesive layers 38,40 are formed on substrate bond pads 32,24 before bumps 28,30 are contacted to substrate bond pads 32,34. Examples of adhesives which can be used include thermosets, thermoplastics and polymer thick film. Adhesive layers 38, 40 are formed on substrate bond pads 32, 34 by screen printing, stenciling, or by some other conventional method.

Figure 9:
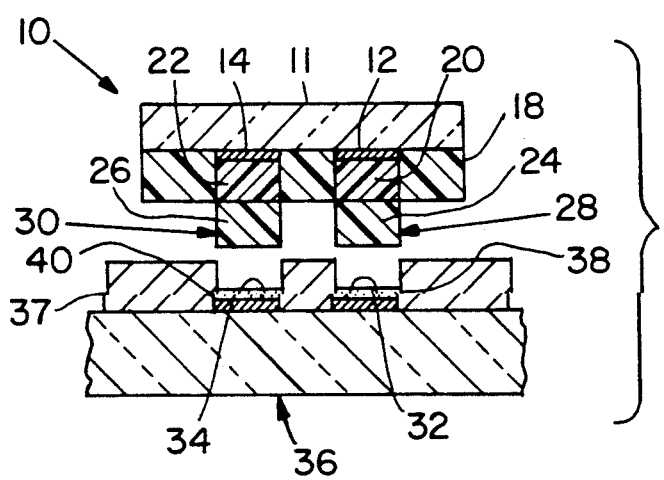
FIG. 9 is a section view of the embodiment of FIG. 1 and of the substrate shown in FIG. 8 after aligning the bumps of the flip chip with substrate bond pads.
Figure 10:
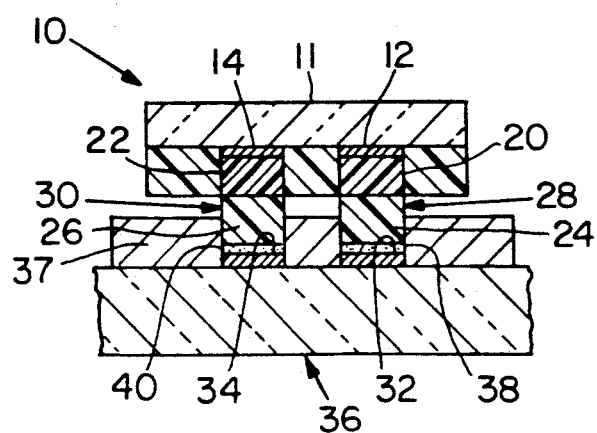
FIG. 10 is a section view of the embodiment shown in FIG. 9 after contact of the bumps of the flip chip with the substrate bond pads.

As shown in FIG. 9, bumps 28,30 are located on flip chip is in a position which is aligned with the known position of bond pads 32,34 on substrate 36. As shown in FIG. 10, bond pads 32,34 are then brought into contact with bumps 28,30. Adhesive layers 38,40 are then polymerized by a suitable method, such as by heating, to form electrically conductive interconnections between substrate bond pads 32,34 and bumps 28,30, thereby forming electrical interconnections between flip chip bond pads 12,14 and substrate bond pads 32,34.

The electrically conductive polymerizable precursor used to form first layers 20,22 and second layers 24,26 of bumps 28,30 can be a B-stage polymer. Examples of suitable B-stage polymers include thermosets and thermoplastics. Solvents within the B-stage polymer can be substantially evaporated from the electrically conductive polymerizable precursor comprising bumps 28,30 before bumps 28,30 are contacted to substrate bond pads 32,34. Evaporation of the solvent within the B-stage polymer causes the bumps 28,30 to retain a substantially rigid shape while the flip chip is manipulated for contacting bumps 28,30 to substrate 36. The B-stage polymer can subsequently be polymerized to form electrical interconnections between flip chip bond pads 12,14 and substrate bond pads 32,34.

In a preferred embodiment, flip chip 11 is aligned over substrate 36 by a flip chip aligner bonder, such as model "M-8", manufactured by Research Devices, Division of the American Optical Corporation.

EQUIVALENTS

Although preferred embodiments have been specifically described and illustrated herein, it will be appreciated that many modifications and variations of the present invention are possible, in light of the above teachings, within the purview of the following claims, without departing from the spirit and scope of the invention. For example, while the discussion is directed to a single flip chip on a substrate which flip chip has only one circuit and two bond pads, it is to be understood that the concept can be readily expanded to include a plurality of chips with a plurality of circuits and bond pads on each.

We claim:

1. A method of forming an electrically conductive interconnection between a bond pad of a flip chip and a bond pad of a substrate, comprising the steps of:
   a) selectively forming a first organic protective layer over a surface of the flip chip around the flip chip bond pad, leaving the flip chip bond pad exposed;
   b) forming an electrically conductive polymerizable precursor layer on the flip chip bond pad to a level extending beyond the first organic protective layer to produce a bump;
   c) selectively forming a second organic protective layer over a surface of the substrate around the substrate bond pad, leaving the substrate bond pad exposed; and
   d) forming an electrical interconnection between the bump and the substrate bond pad, thereby forming an electrical interconnection between the flip chip bond pad and the substrate bond pad.

2. A method of claim 1 wherein the electrical interconnection between the bump and the substrate bond pad is formed by:
   a) disposing an electrically conductive adhesive on the substrate bond pad;
   b) contacting the bump with the electrically conductive adhesive; and
   c) polymerizing the electrically conductive adhesive.

3. A method of claim 2 wherein the second organic protective layer is selectively formed over the surface of the substrate to a level extending beyond the level of the substrate bond pad.

4. The method of claim 3 wherein the first organic protective layer and the second organic protective layer includes a dielectric polymer.

5. The method of claim 4 wherein the electrically conductive polymerizable precursor is screen printed onto the flip chip bond pad.

6. The method of claim 4 wherein the electrically conductive polymerizable precursor layer is formed by stenciling the electrically polymerizable precursor onto the flip chip bond pad.

7. The method of claim 1 wherein the first organic protective layer defines the area for forming the electrically conductive polymerizable precursor layer on the flip chip bond pad.

8. A method of forming an electrically conductive interconnection between a bond pad of a flip chip and a bond pad of a substrate comprising the steps of:
   a) selectively forming a first organic protective layer over a surface of the flip chip around the flip chip bond pad, leaving the flip chip bond pad exposed;
   b) forming a first electrically conductive polymerizable precursor layer on the flip chip bond pad;
   c) forming a second electrically conductive polymerizable precursor layer over the first electrically conductive polymerizable precursor layer, the second electrically conductive polymerizable precursor layer and the first layer together forming a bump;
   d) selectively forming a second organic protective layer over a surface of the substrate around the substrate bond pad, leaving the substrate bond pad exposed;
   e) forming an electrical interconnection between the bump and the substrate bond pad, thereby forming an electrical interconnection between the flip chip bond pad and the substrate bond pad.

9. A method of claim 8 wherein the electrical interconnection between the bump and the substrate bond pad is formed by:
   a) disposing an electrically conductive adhesive on the substrate bond pad;
   b) contacting the bump with the electrically conductive adhesive; and
   c) polymerizing the electrically conductive adhesive.

10. A method of claim 9 wherein the second organic protective layer is selectively formed over the surface of the substrate to a level extending beyond the level of the substrate bond pad.

11. The method of claim 10 wherein the first organic protective layer and the second organic protective layer include a dielectric polymer.

12. The method of claim 11 wherein the second electrically conductive polymerizable precursor layer is screen printed onto the first electrically conductive polymerizable precursor layer.

13. The method of claim 11 wherein the second electrically conductive polymerizable precursor layer is stenciled onto the first electrically conductive polymerizable precursor layer.

14. The method of claim 10 wherein the electrically conductive polymerizable precursor layers are polymerized to form an electrically conductive bump prior to contacting the bump to the substrate bond pad.

15. The method of claim 14 wherein the electrically conductive adhesive is stenciled onto the substrate bond pad.

16. The method of claim 8 wherein the first organic protective layer defines the area for forming the electrically conductive polymerizable precursor layer on the flip chip bond pad.

17. A method of forming an electrically conductive interconnection between a bond pad of a flip chip and a bond pad of a substrate comprising the steps of:
   a) selectively forming a first organic protective layer over a surface of the flip chip around the flip chip bond pad, leaving the flip chip bond pad exposed;
   b) forming a first electrically conductive polymerizable precursor layer on the flip chip bond pad;
   c) drying the first electrically conductive polymerizable precursor layer;
   d) forming a second electrically conductive polymerizable precursor layer over the first electrically conductive polymerizable precursor layer to a level extending beyond the first organic protective layer;
   e) drying the second electrically conductive polymerizable precursor layer to form a bump on the flip chip;
   f) selectively forming a second organic protective layer over a surface of the substrate around the substrate bond pad to a level extending beyond the level of the substrate bond pad, leaving the substrate bond pad exposed;
   g) contacting the bump to the substrate bond pad; and
   h) while so contacted, polymerizing the bump to form an electrically conductive interconnection between the flip chip bond pad and the substrate bond pad.

18. A method of forming an electrically conductive interconnection between a bond pad of a flip chip and a bond pad of a substrate comprising the steps of:
   a) selectively forming a first organic protective layer over a surface of the flip chip around the flip chip bond pad, leaving the flip chip bond pad exposed;
   b) forming a first electrically conductive polymerizable precursor layer on the flip chip bond pad;
   c) polymerizing the first electrically conductive polymerizable precursor layer to form a first electrically conductive polymer layer;
   d) forming a second electrically conductive polymer layer on the first electrically conductive polymer layer to a level extending beyond the first organic protective layer;
   e) polymerizing the second electrically conductive polymerizable precursor layer to form a second electrically conductive polymer layer, the first electrically conductive polymer layer and the second electrically conductive polymer layer together forming an electrically conductive bump on the flip chip bond pad;
   f) selectively forming a second organic protective layer on a surface of the substrate to a level extending beyond the level of the substrate bond pad, leaving the substrate bond pad exposed;
   g) applying an electrically conductive adhesive to the substrate bond pad; and
   h) contacting the electrically conductive adhesive to the electrically conductive bump to form an electrically conductive interconnection between the flip chip bond pad and the substrate bond pad.

19. The method of claim 18 further including the step of polymerizing the electrically conductive adhesive while the electrically conductive adhesive is in contact with the substrate bond pad and the flip chip bond pad.

* * * * *